US009335035B2

(12) United States Patent
Funakubo (10) Patent No.: US 9,335,035 B2
(45) Date of Patent: *May 10, 2016

(54) LIGHTING DEVICE INCLUDING LIGHT-EMITTING ELEMENT

(71) Applicant: CITIZEN ELECTRONICS CO., LTD, Yamanashi (JP)

(72) Inventor: Takuya Funakubo, Yamanashi (JP)

(73) Assignees: Citizen Electronics Co., Ltd., Yamanashi (JP); Citizen Holdings Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/818,615

(22) Filed: Aug. 5, 2015

(65) Prior Publication Data

US 2015/0345763 A1  Dec. 3, 2015

Related U.S. Application Data

(63) Continuation of application No. 14/319,760, filed on Jun. 30, 2014, now Pat. No. 9,146,026, which is a continuation of application No. 13/690,121, filed on Nov. 30, 2012, now Pat. No. 8,833,982.

(30) Foreign Application Priority Data

Dec. 2, 2011 (JP) ................................. 2011-265239

(51) Int. Cl.
*F21V 23/00* (2015.01)
*F21V 21/00* (2006.01)
(Continued)

(52) U.S. Cl.
CPC ................. *F21V 23/005* (2013.01); *F21K 9/00* (2013.01); *F21K 9/90* (2013.01); *F21V 7/00* (2013.01);
(Continued)

(58) Field of Classification Search
CPC ......... F21V 23/005; F21V 7/22; F21V 23/06; F21Y 2105/001; H01L 25/0753; H01L 33/60; H01L 33/62
See application file for complete search history.

(56) References Cited

U.S. PATENT DOCUMENTS 7,642,704 B2  1/2010  Imai et al.
7,824,049 B2  11/2010  Kaneko et al.
(Continued)

FOREIGN PATENT DOCUMENTS

JP  2006-5290 A  1/2006
JP  2008-71895 A  3/2008
(Continued)

OTHER PUBLICATIONS

English Translation of JP 2010-287657, Dec. 24, 2010.
(Continued)

*Primary Examiner* — Mary Ellen Bowman
(74) *Attorney, Agent, or Firm* — RatnerPrestia (57) ABSTRACT

In accordance with a first aspect of the present inventive subject matter, a lighting device includes light-emitting elements arranged in lines that are extended in parallel with one another, the light-emitting elements being divided into groups each including the same number of light-emitting elements, a first connecting electrode is disposed adjacent to one end portion of the lines extended, a second connecting electrode is disposed adjacent to another end portion of the lines extended, and the light-emitting elements within each group are electrically connected in series with one another by metallic wires and electrically connected in series to the first connecting electrode and to the second connecting electrode. The groups each include the same number of light-emitting elements that are electrically connected in parallel between the first connecting electrode and the second connecting electrode.

15 Claims, 6 Drawing Sheets

(51) Int. Cl.
| | |
|---|---|
| *F21V 7/00* | (2006.01) |
| *F21V 9/00* | (2015.01) |
| *F21V 23/06* | (2006.01) |
| *F21V 7/22* | (2006.01) |
| *H01L 33/60* | (2010.01) |
| *H01L 33/62* | (2010.01) |
| *H05B 33/08* | (2006.01) |
| *H01L 25/075* | (2006.01) |
| *F21K 99/00* | (2016.01) |
| *F21Y 105/00* | (2016.01) |
| *H01L 33/52* | (2010.01) |

(52) U.S. Cl.
CPC ... *F21V 7/22* (2013.01); *F21V 9/00* (2013.01); *F21V 21/00* (2013.01); *F21V 23/06* (2013.01); *H01L 25/0753* (2013.01); *H01L 33/60* (2013.01); *H01L 33/62* (2013.01); *H05B 33/0803* (2013.01); *F21K 9/135* (2013.01); *F21Y 2105/001* (2013.01); *H01L 33/52* (2013.01); *H01L 2224/48137* (2013.01); *H01L 2224/49113* (2013.01); *Y10T 29/4913* (2015.01)

(56) References Cited

U.S. PATENT DOCUMENTS

| | | |
|---|---|---|
| D650,760 S | 12/2011 | Hussell |
| 8,455,908 B2 | 6/2013 | Welch |
| 8,564,000 B2 | 10/2013 | Hussell |
| 8,575,639 B2 | 11/2013 | Hussell |
| 8,624,270 B2 | 1/2014 | Park |
| 8,624,271 B2 | 1/2014 | Reiherzer |
| 8,729,589 B2 | 5/2014 | Hussell |
| D706,231 S | 6/2014 | Hussell |
| 2011/0254022 A1 | 10/2011 | Sasano |
| 2011/0286200 A1 | 11/2011 | Iimura |
| 2012/0126255 A1 | 5/2012 | Hussell |
| 2012/0126257 A1 | 5/2012 | Reiherzer |
| 2012/0193651 A1 | 8/2012 | Edmond |
| 2012/0205689 A1 | 8/2012 | Welch |
| 2012/0299022 A1 | 11/2012 | Hussell |
| 2013/0077299 A1 | 3/2013 | Hussell |
| 2013/0264591 A1 | 10/2013 | Hussell |
| 2013/0334548 A1 | 12/2013 | Welch |
| 2014/0097453 A1 | 4/2014 | Hussell |
| 2014/0097454 A1 | 4/2014 | Hussell |

FOREIGN PATENT DOCUMENTS

| | | |
|---|---|---|
| JP | 208-147453 | 6/2008 |
| JP | 2008-258296 A | 10/2008 |
| JP | 2008258296 | 10/2008 |
| JP | 2010-272719 A | 12/2010 |
| JP | 2010287657 | 12/2010 |
| JP | 2011-238902 A | 11/2011 |
| JP | 2011238902 | 11/2011 |
| JP | 2012071136 | 5/2012 |
| WO | WO 2011/052639 A1 | 5/2011 |
| WO | WO 2011/085146 A2 | 7/2011 |

OTHER PUBLICATIONS

Entire patent prosecution history of U.S. Appl. No. 13/690,121, filed Nov. 30, 2012, entitled, "Lighting Device Including Light-Emitting Element," now U.S. Pat. No. 8,833,982, issued Sep. 16, 2014.

Entire patent prosecution history of U.S. Appl. No. 14/319,760, filed Jun. 30, 2014, entitled, "Lighting Device Including Light-Emitting Element and Method for Manufacturing the Same."

Japanese Submission of Publications mailed Jan. 27, 2014 for Japanese Application No. 2011-265239.

Japanese Office Action for JP 2011-265239 and English Translation Issued Aug. 4, 2015.

Japanese Office Action of Corresponding Japanese Patent Application 2011-265239, Received March 15, 2016.

FIG.1

PRIOR ART

LIGHTING DEVICE INCLUDING LIGHT-EMITTING ELEMENT

RELATED APPLICATIONS

This application is a continuation of U.S. application Ser. No. 14/319,760, filed on Jun. 30, 2014, which itself is a continuation of U.S. application Ser. No. 13/690,121, filed Nov. 30, 2012, which claims benefit of JP 2011-265239, filed Nov. 2, 2011, the entire contents of U.S. application Ser. Nos. 14/319,760, 13/690,121 and JP 2011-265329 are hereby incorporated by reference in their entireties for all purposes.

TECHNICAL FIELD

The present invention relates to a lighting device including light-emitting elements arranged in lines that are extended in parallel with one another between a first electrode and a second electrode. Also, the present invention relates to a lighting device including light-emitting elements arranged in lines that are extended in parallel with one another in a circular mounting area between a first electrode and a second electrode.

BACKGROUND

In recent years, a light-emitting diode (LED) element, which is a semiconductor element, is widely used for backlight, lighting, etc., of a color display device, a light bulb, lighting equipment, lighting system, a headlamp of a vehicle and so on.

A lighting device including a plurality of LED elements arranged in a mounting area has been proposed, for example, Patent Document 1: Japanese Unexamined Patent Publication (Kokai) No. 2010-287657.

Figure 1:
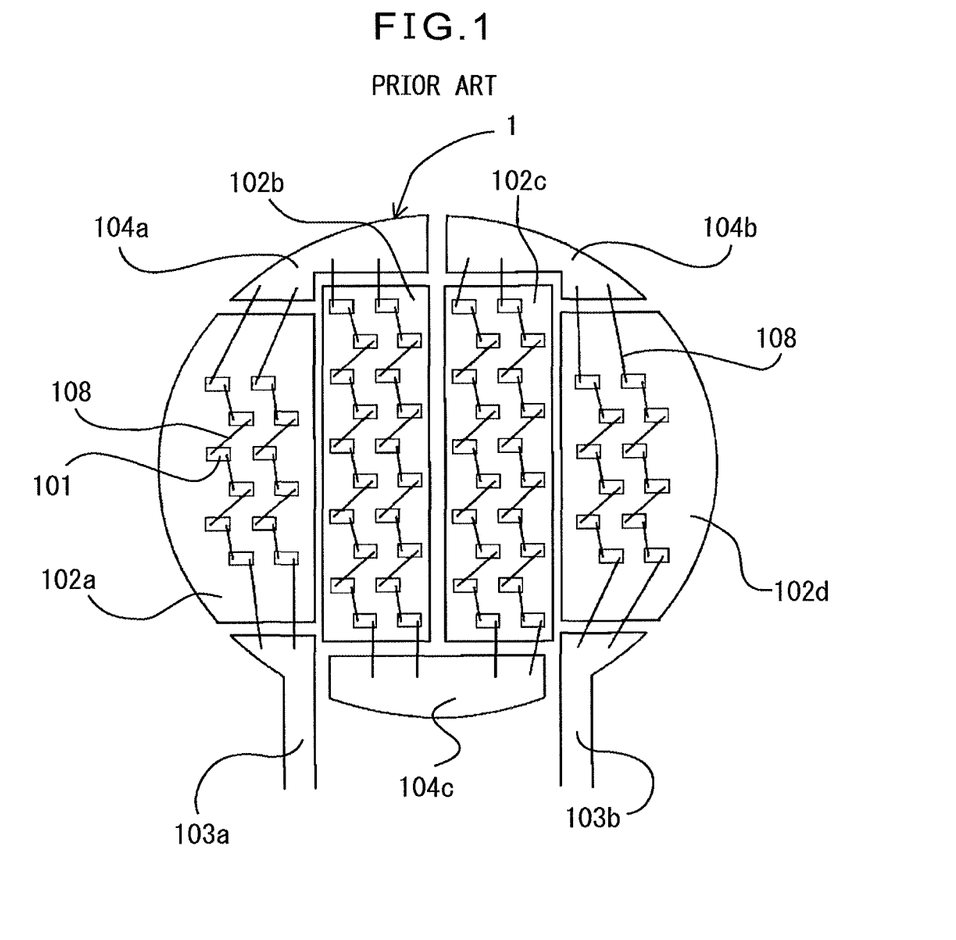
FIG. 1 is a plan view of a light emitting portion in a conventional LED light emitting device.

Hereinafter, a light-emitting portion 1 of a conventional light-emitting module shown in FIG. 1 is briefly explained. The light-emitting elements 101 each including a pair of element electrodes are disposed in columns in a zigzag arrangement on light-reflecting layers or separated mounting areas 102*a*-102*d*. At least some of the light-emitting elements 101 are electrically connected to one another in series by bonding wires 108 and electrically connected to electrical conductors 103*a*, 103*b*, 104*a*, 104*b*, and/or 104*c* at both ends of each column.

SUMMARY

In accordance with a first aspect of the present inventive subject matter, a lighting device includes light-emitting elements arranged in lines that are extended in parallel with one another, the light-emitting elements being divided into groups each including the same number of light-emitting elements, a first connecting electrode disposed adjacent to a first end portion of the lines extended, a second connecting electrode disposed adjacent to a second end portion of the lines extended, and the light-emitting elements within each group are electrically connected in series with one another by metallic wires and electrically connected in series to the first connecting electrode and to the second connecting electrode. The groups each include the same number of light-emitting elements that are electrically connected in parallel between the first connecting electrode and the second connecting electrode.

In accordance with a second aspect of the present inventive subject matter, a lighting device includes a substrate that includes a circular mounting area, a first connecting electrode disposed on the substrate, and a second connecting electrode oppositely disposed on the substrate to the first connecting electrode across the circular mounting area, and light-emitting elements arranged in lines that are extended in parallel with one another at the circular mounting area of the substrate between the first electrode and the second electrode disposed on the substrate and that include a central line extended in a central portion of the mounting area between the first connecting electrode and the second connecting electrode and include a line of periphery positioned away from the central line in a perpendicular direction perpendicular to the central line, and the light-emitting elements arranged in the central line outnumbers the light-emitting element arranged in the line of periphery. The light-emitting elements in the lines are divided into groups each including the same number of light-emitting elements, the light-emitting elements within each group are electrically connected in series with one another by metallic wires and electrically connected in series to a first electrode and to a second electrode, and the groups each include the same number of light-emitting elements are electrically connected in parallel between the first connecting electrode and the second connecting electrode.

In some embodiments, it is disclosed that there is a group that includes the light-emitting elements arranged in two or more lines.

Also, in other embodiments, it is disclosed that there is a group that includes some of the light-emitting elements arranged in three or more lines.

DESCRIPTION OF EMBODIMENTS

It will be understood that, although the terms first, second, etc. may be used herein to describe various elements and/or portions of an element, these elements and/or portions of an element should not be limited by these terms. These terms are only used to distinguish one element from another and/or one portion from another of an element. For example, a first element and/or a first portion could be termed a second element and/or a second portion, and, similarly, a second element and/or a second portion could be termed a first element and/or a first portion, without departing from the scope of the present invention.

As used herein, the term "and/or" includes any and all combinations of one or more of the associated listed items.

The terminology used herein is for the purpose of describing particular embodiments only and is not intended to be limiting of the invention.

As used herein, the singular forms "a", "an" and "the" are intended to include the plural forms as well, unless the context clearly indicates otherwise. It will be further understood that the terms "comprises", "comprising," "includes", "including", "has" and/or "having" when used herein, specify the presence of stated features, integers, steps, operations, elements, and/or components, but do not preclude the presence or addition of one or more other features, integers, steps, operations, elements, components, and/or groups thereof.

Also, as used herein, the term "center axis" is an invisible line that passes through a center of a designated element and/or portion and shown as a broken line in Figures.

Furthermore, as used herein, the term "light-emitting element" may be used as a light-emitting diode (LED) element including a first electrode and a second electrode as a bare chip in some embodiments. The bare chip may be a wafer-level chip. In other embodiments, the term "light-emitting element" may be used as an LED chip including a light-emitting diode (LED) element with a first electrode and a second electrode, and a substrate on that the LED element is electrically mounted. The light-emitting element may appear to be a square or rectangular in shape as viewed from above.

A phosphor layer or plate that is configured to receive light emitted from the light-emitting element may be disposed in contact with the light-emitting element or may be disposed above the light-emitting element. The phosphor layer includes a phosphor that can convert light emitted from the light-emitting element and emit converted light of wavelength different from the wavelength of light emitted from the light-emitting element.

Relative terms such as "below" or "above" or "upper" or "lower" may be used herein to describe a relationship of one element, layer or region to another element, layer or region as illustrated in the figures. It will be understood that these terms are intended to encompass different orientations of the device in addition to the orientation depicted in the figures.

Embodiments of the invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Embodiments of the invention are described with reference to drawings included herewith. Same and/or similar reference numbers refer to same and/or similar structures throughout. It should be noted that the drawings are schematic in nature. Not all parts are always shown to scale.

(First Embodiment)

Hereinafter, configurations of LED light emitting devices in embodiments of the present invention are explained with reference to the drawings.

Figure 2:
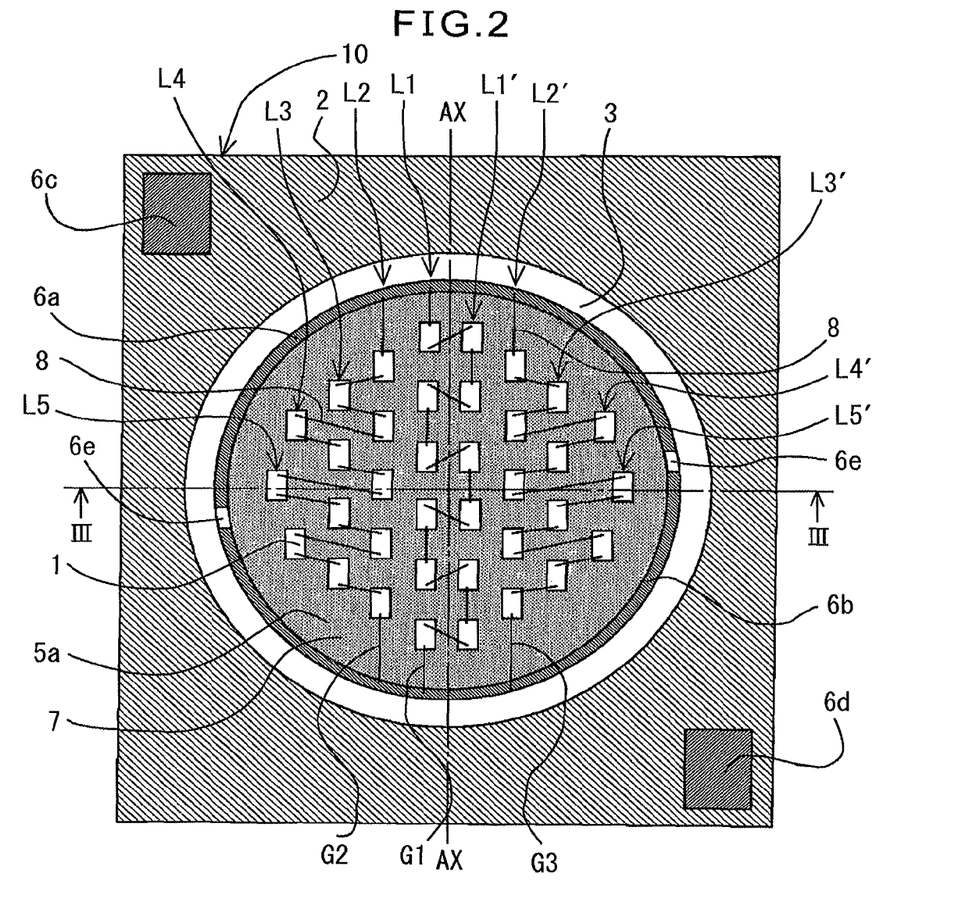
FIG. 2 is a plan view of a lighting device according to a first embodiment of the present invention.

FIG. 2 is a plan view of a lighting device 10 according to a first embodiment of the present invention. As shown in FIG. 2, a lighting device 10 includes light-emitting elements 1 arranged in lines that are extended in parallel with one another, the light-emitting elements 1 being divided into groups each including the same number of light-emitting elements 1, a first connecting electrode 6a disposed adjacent to a first end portion of the lines extended, and a second connecting electrode 6b disposed adjacent to a second end portion of the lines extended. The light-emitting elements 1 within each group are electrically connected in series with one another by metallic wires 8 and electrically connected in series to the first connecting electrode 6a at a first end of each group by a metallic wire 8 and to the second connecting electrode 6b at a second end of each group by a metallic wire 8.

For more details, a lighting device 10 includes a substrate 2 that includes a circular mounting area 7, a first connecting electrode 6a disposed on the substrate 2, and a second connecting electrode 6b oppositely disposed on the substrate 2 to the first connecting electrode 6a across the circular mounting are 7, and light-emitting elements 1 arranged in lines that are extended parallel with one another at the circular mounting area 7 of the substrate 2 between the first connecting electrode 6a and the second connecting electrode 6b disposed on the substrate 2 and that includes a central line L1 extended in a central portion of the mounting area 7 between the first connecting electrode 6a and the second connecting electrode 6b and include a line of periphery L5 positioned away from the central line L1 in a perpendicular direction perpendicular to the central line L1 or a center axis AX of the mounting area 7. The perpendicular direction here coincides with a direction of a line III-III extending as shown in FIG. 2. The light-emitting elements 1 arranged in the central line L1 outnumbers the light-emitting element(s) 1 arranged in the line of periphery L5. In this embodiment, the number of the light-emitting elements 1 disposed in the line of periphery L5 is one, but the number of the light-emitting elements 1 disposed in the line of periphery L5 is not limited to this. The number of the light-emitting elements disposed in the line of periphery L5 may be two or more.

The light-emitting elements 1 arranged in the lines are divided into groups G1-G3 each including the same number of light-emitting elements 1. In this embodiment the number of light-emitting elements 1 included in each group is twelve. As shown in this embodiment, the lighting device 10 can include a group that includes some of the light-emitting elements arranged in two lines L1, L1' as group G1. Also, the lighting device 10 can include a group that includes some of the light-emitting elements 1 arranged in four lines, for example, as group G2 and group G3.

The light-emitting elements 1 within each group are electrically connected in series with one another by metallic wires 8 and electrically connected in series to the first electrode 6a and to the second electrode 6b of the substrate 2.

The groups G1, G2, and G3 each including the same number of light-emitting elements 1 are electrically connected in parallel between the first connecting electrode 6a and the second connecting electrode 6b.

The lines further include one or more intermediate lines L2-L4 extended between the first connecting electrode 6a and the second connecting electrode 6b. The one or more intermediate lines L2-L4 are positioned between the central line L1 and the line of periphery L5. The one or more intermediate lines each include light-emitting elements 1.

The number of light-emitting elements 1 disposed in each line decreases from in the central line L1 through in the intermediate lines L2-L4 to in the line of periphery L5. In this embodiment, the central line L1 includes six light-emitting elements 1. The first intermediate line L2 away from the central line L1 in the perpendicular direction perpendicular to the central line L1 or the central axis AX of the circular mounting area 7 and is positioned at a left side of the central line L1 as shown in FIG. 1 includes five light-emitting elements 1. The second intermediate line L3 away from the central line L1 in the perpendicular direction to the central line L1 and is positioned at a left side of the first intermediate line L2 includes four light-emitting elements 1. The third intermediate line L4 away from the central line L1 in the perpendicular direction to the central line L1 and is positioned at a left side of the second intermediate line L3 includes two light-emitting elements 1. The line of periphery L5 is positioned at a left side of the intermediate line L4 and includes one light-emitting element 1. The light-emitting elements 1 included in the intermediate lines L2-L4 are shifted with respect to the light-emitting elements 1 included in a neighboring line. In other words, the light-emitting elements 1 included in the intermediate lines L2-L4 are not aligned with respect to the light-emitting elements 1 included in the neighboring line. A neighboring line of the first intermediate line L2 is, for example, the central line L1 or the second intermediate Line L3. As a result, it may be possible to prevent light laterally and/or downwardly emitted from the light-emitting elements 1 from being shaded by side surfaces of light-emitting elements 1 that are disposed in neighboring lines. Also, if the light-emitting elements 1 included in the intermediate lines L2-L4 are shifted with respect to the light-emitting elements 1 included in a neighboring line, it is possible to arrange the light-emitting elements at the circular mounting area as evenly as possible.

The light-emitting elements 1 arranged in lines are positioned symmetrically with respect to a center axis AX of the circular mounting area 7. In this embodiment, at a left side of the center axis AX of the circular mounting area 7, the central line L1, the first intermediate line L2, the second intermediate line L3, the third intermediate line L4, and the line of periphery L5 are disposed between the first connecting electrode 6a and the second connecting electrode 6b, and at a right side of the center axis AX of the circular mounting area 7, the central line L1', the first intermediate line L2', the second intermediate line L3', the third intermediate line L4, and the line of periphery L5 are disposed between the first connecting electrode 6a and the second connecting electrode 6b. The lines L1-L5 and L1'-L5' are extended along the center axis AX of the circular mounting area 7 as shown in FIG. 2.

In this embodiment, the light-emitting element 1 includes a first electrode and a second electrode that are positioned at an upper surface of the light-emitting element 1. In the light-emitting elements 1 electrically connected in series with one another in each group, the first electrode 1a of a first light-emitting element of the light-emitting elements 1 is electrically connected by a metallic wire to the second electrode 1b of a second light-emitting element of the light-emitting elements 1, and the second electrode 1b of the first light-emitting element is electrically connected by a metallic wire to the first electrode 1a of a third light-emitting element of the light-emitting elements 1 in each group, for example.

The light-emitting elements 1 each include a first electrode 1a and a second electrode 1b positioned at an upper surface of each light-emitting element, and the first electrode 1a of each light-emitting element 1 positioned at a side of the first connecting electrode 6a disposed on the substrate 2 and the second electrode 1b of each light-emitting element 1 positioned at a side of the second connecting electrode 6b disposed on the substrate 2. With this arrangement of the first electrode 1a and the second electrode 1b of the light emitting element 1, wire bonding connection among the light-emitting elements 1, the first connecting electrode 6a and the second connecting electrode 6b can be easier.

Also, in this embodiment, the first connecting electrode 6a is disposed along an outline of the circular mounting portion 7, and the second connecting electrode 6b is disposed along an outline of the circular mounting portion 7. An electrically insulating portion 6e is provided between the first connecting electrode 6a and the second connecting electrode 6b.

Figure 3:
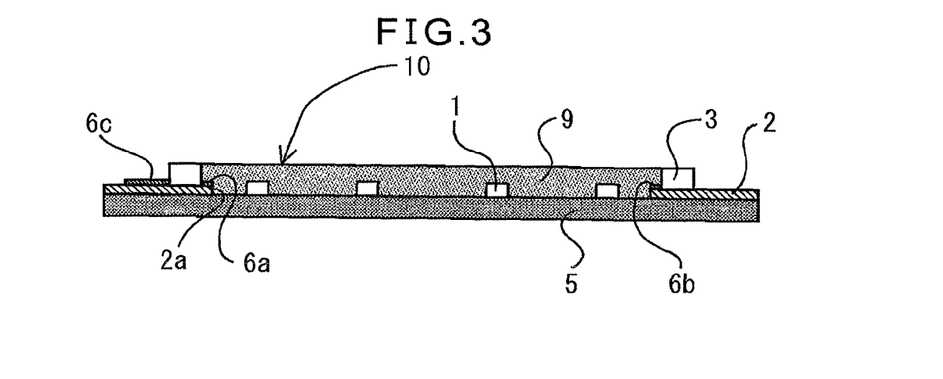
FIG. 3 is a cross-sectional view taken along line III-III of the lighting device shown in FIG. 2.

The first connecting electrode 6a may include an arc shape along the outline of the circular mounting portion 7 and the second connecting electrode 6b includes an arc shape along the circular mounting portion 7. FIG. 3 is a sectional view taken along line III-III of FIG. 2. As shown in FIG. 3, the substrate 2 further includes an opening 2a that passes through the substrate 2 from an upper surface to a lower surface of the substrate 2, and a metal base 5 disposed in contact with the lower surface of the substrate 2. The metal base 5 may include a flat upper surface attached to the lower surface of the substrate 2. The opening 2a of the substrate 2 demarcates the circular mounting area in that the upper surface of the metal base appears, and the light-emitting elements 1 are thermally connected to the upper surface of the metal base 5. The substrate 2 may include an electrically-insulating material, for example, a resin and/or ceramic. In this embodiment, a frame 3 around the mounting portion 7 is provided on the upper surface of the substrate 2. The first connecting electrode 6a and the second connecting electrode 6b may be positioned within the frame 3, and a space demarcated by the frame 3 is filled with a light-transmitting resin 9. The light-transmitting resin 9 seals the light-emitting elements 1 and electrical connection including metallic wires 8 among the light-emitting elements 1 and the first connecting electrode 6a and the second connecting electrode 6b, and is configured to be a light-emitting area of the lighting device 10. The light-transmitting resin 9 may include a phosphor that receives light emitted from the light-emitting element 1 and emits light in wavelength different from light that is directly emitted from the light-emitting element 1. Furthermore, the light-transmitting resin 9 may include a light-diffusing particle to diffuse light. Also, it is possible to dispose a first outer connecting electrode 6c and a second outer connecting electrode 6d outside the light-emitting area of the lighting device 10 on the substrate 2. The first connecting electrode 6a can be electrically connected to the first outer connecting electrode 6c and the second connecting electrode 6b can be electrically connected to the second outer connecting electrode 6d through an electrode pattern (not shown) printed on the substrate 2, for example. The first outer connecting electrode 6c and the second outer connecting electrode 6b may be electrically connected to electrodes disposed on a mother board or may be electrically connected to terminals of a lighting bulb, for example.

As the number of the light-emitting elements 1 included in each line decreases from a central portion of the circular mounting area 7 to a peripheral portion in a perpendicular direction perpendicular to the center axis AX of the circular mounting area 7, the light-emitting elements 1 can be disposed in accordance with the circular shape of the mounting area 7.

In this embodiment, there are two central lines L1, L1' are extended in the central portion between the first connecting electrode 6a and the second connecting electrode 6b. The light-emitting elements 1 included in the two central lines L1, L1' are configured to be a first group G1. The light-emitting elements 1 within the first group G1 are electrically connected in series with one another by metallic wires 8 and electrically connected in series to the first electrode 6a and to the second electrode 6b of the substrate 2. At the left side of the center axis AX of the circular mounting area 7, the light-emitting elements 1 included in a first intermediate line L2, a second intermediate line L3, a third intermediate line L4, and the line of periphery L5 are configured to be a second group G2. The light-emitting elements 1 within the second group G2 are electrically connected in series with one another by metallic wires 8 and electrically connected in series to the first electrode 6a and to the second electrode 6b of the substrate 2.

At the right side of the center axis AX of the circular mounting area 7, the light-emitting elements 1 included in a first intermediate line L2', a second intermediate line L3', a third intermediate line L4' and a line of periphery L5' are configured to be a third group G3. The light-emitting elements 1 included in the second group G2 and the light-emitting elements 1 included in the third group G3 are positioned symmetrically with respect to the center axis AX of the circular mounting area 7.

The number of the light-emitting elements 1 in the first group G1, the number of the light-emitting elements 1 in the second group G2, and the number of the light-emitting elements 1 in the third group G3 are the same; twelve in this embodiment. Generally, twelve light-emitting elements 1 electrically connected in series with one another light up brighter than twelve light-emitting elements 1 electrically connected in parallel with one another. In this embodiment, since the light-emitting elements 1 electrically connected in series with one another in each group, the light-emitting area of the lighting device 10 can emit a certain amount of light. At the same time, since the first group L1, the second group L2, and the third group L3 are electrically connected in parallel between the first connecting electrode 6a and the second connecting electrode 6b, the lighting device 10 can consume lower amounts of power, compared to a lighting device in which all of light-emitting elements are electrically connected in series to one another. Furthermore, with a combination of serial connection and parallel connection, it is possible to prevent from a sudden cutout of electricity supply to all of the light-emitting elements.

Also, in this embodiment, the light-emitting elements 1 can be disposed in accordance with the circular shape of the mounting area 7.

In this embodiment, the light-emitting elements 1 is directly mounted on the upper surface of the metal base 5. The metal base 5 can be made from aluminum. In this case, the upper surface of the metal base 5 may include a layer of alumite treatment. Also, it is possible to dispose a light-reflecting layer on the layer of alumite treatment of the metal base 5 at the mounting area 7 and the light-emitting elements 1 disposed on the metal base 5 through the light-reflecting layer. The light-reflecting layer may be electrically insulating, but thermally conductive. Accordingly, heat generated from the light-emitting elements 1 can be efficiently released through the metal base 5 to outside of the lighting device 10. Also, as mentioned above, as the first group G1, the second group G2, and the third group G3 includes the same number of light-emitting elements 1, it is possible to drive light-emitting elements in each group under a common drive conditions.

(Second Embodiment)

Figure 4:
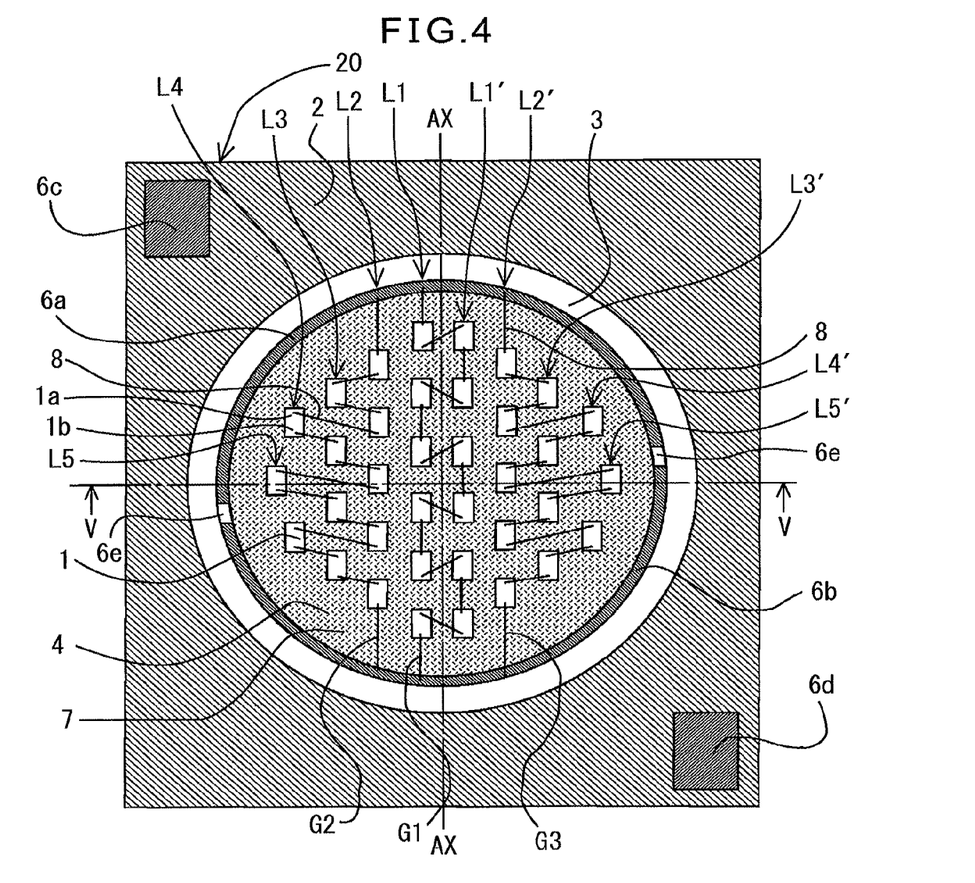
FIG. 4 is a plan view of a lighting device according to a second embodiment of the present invention.
Figure 5:
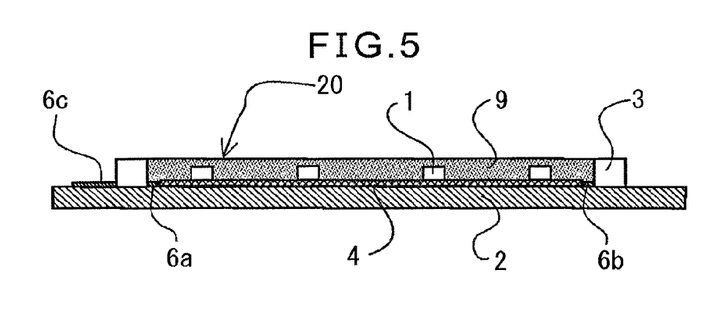
FIG. 5 is a cross-sectional view taken along line V-V of the lighting device shown in FIG. 4.

FIG. 4 is a plan view of a lighting device 20 according to a second embodiment of the present invention. A basic configuration of the lighting device 20 in the second embodiment is similar to a basic configuration of the lighting device 10 as shown in FIG. 2, and a same reference numeral is attached to a same and/or similar element, portion, line, and/or group, and repeated explanation is omitted. The lighting device 20 differs from the lighting device 10 in a configuration around the mounting area 7. In the lighting device 10, the light-emitting elements 1 are directly disposed on the upper surface of the metal base 5 that appears in the opening 2a of the substrate 2 or the light-emitting elements 1 are disposed on a light-reflecting layer formed on the upper surface of the metal base 5, and therefore, the light-emitting elements 1 are thermally connected to the metal base 5. On the other hand, the lighting device 20 includes a substrate 2 that is made from a resin or a ceramic, and a circular light-reflecting layer 4 is disposed at a central portion of the substrate 2. In this embodiment, the circular light-reflecting layer 4 demarcates the circular mounting area 8 of the substrate 2. The circular light-reflecting layer 4 is an electrically-insulating layer and the light-emitting elements 1 are mounted on the light-reflecting layer 4. The first connecting electrode 6a is disposed on the upper surface of the substrate 2 and the second connecting electrode 6b is oppositely disposed on the upper surface of the substrate 2 to the first connecting electrode 6a across the circular mounting area 7 that is demarcated by the light-reflecting layer 4. The circular light-reflecting layer 4 may be a white ceramic paste layer or a white resist layer. The circular light-reflecting layer 4 may be formed by printing the white ceramic paste or the white resist.

Other configurations except the portion mentioned above in the lighting device 20 illustrated in FIG. 4 is same or similar to the lighting device 10 shown in FIG. 2, for example in arrangement of the light-emitting elements 1, electrical connection among the light-emitting elements, the first connecting electrode 6a, and the second connecting electrode 6b, and so on.

(Third Embodiment)

Figure 6:
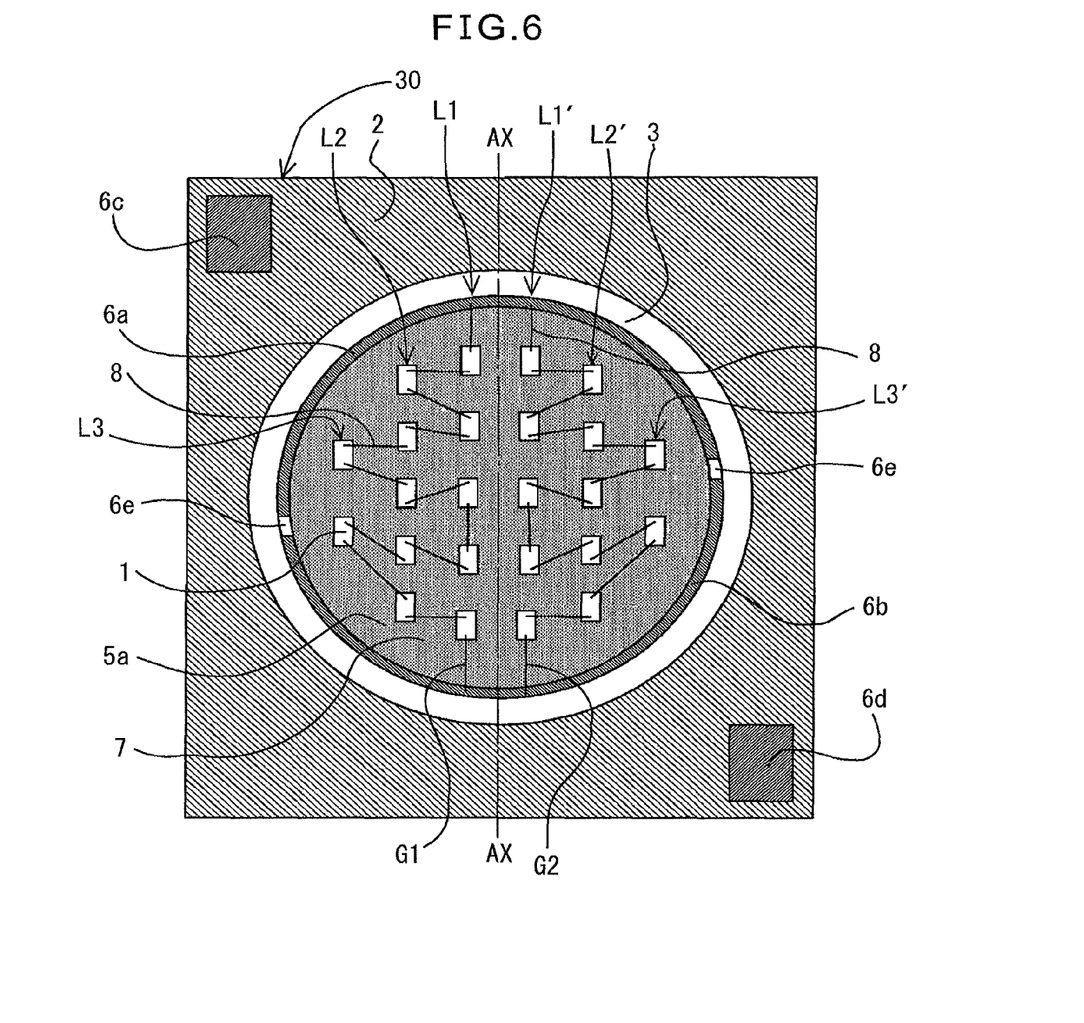
FIG. 6 is a plan view of a lighting device according to a third embodiment of the present invention.

Next, FIG. 6 is a plan view of a lighting device 30 according to a third embodiment of the present invention. A basic configuration of the lighting device 30 is similar to the basic configurations of the lighting device as shown in FIG. 2 and the lighting device as shown in FIG. 4, and a same reference number is attached to a same and/or similar element, portion, line, and/or group, and repeated explanation is omitted. The cross-sectional view can be similar to the cross-sectional view of the lighting device 10, and therefore, omitted.

The lighting device 30 differs from the lighting device 10 in the number of light-emitting elements 1 disposed at the mounting area 7 and an electrically-connecting configuration by the wire 8. For more details, in the lighting device 10, the number of light-emitting elements 1 disposed in ten lines L1-L5 and L1'-L5' at the mounting area 7 is 36, and the 36 light-emitting elements 1 are divided into three groups G1, G2, and G3, as shown in FIG. 2. Each group of the three groups G1, G2, and G3 include 12 light-emitting elements 1. On the other hand, in the lighting device 30, the number of light-emitting elements 1 disposed in six lines L1-L3 and L1'-L3' at the mounting area 7 is 24, and the 24 light-emitting elements 1 are divided into two groups G1 and G2. The light-emitting elements 1 are arranged in lines L1-L3 and L1'-L3' that are extended parallel with one another at the circular mounting area 7 of the substrate 2 between the first connecting electrode 6a and the second connecting electrode 6b. In this embodiment, the central line L1 includes five light-emitting elements 1, and the line of periphery includes two light-emitting elements 1. The light-emitting elements 1 arranged in the central line L1 outnumbers the light-emitting elements 1 arranged in the line of periphery L3. In this embodiment, there is one intermediate line L2 between the central line L1 and the line of periphery L3, and the intermediate line L2 includes five light-emitting elements 1 that is the same number of light-emitting elements 1 included in the central line L1. The light-emitting elements 1 arranged in the intermediate line L2 are shifted with respect to the light-emitting elements 1 arranged in the central line L1.

Also, the light-emitting elements 1 arranged in lines L1-L3 are positioned symmetrically with respect to a center axis AX of the circular mounting area as line L1'-L3'. The center axis AX of the circular mounting area 7 is positioned between the central line L1 and the central line L1'. The lines L1-L3 are disposed at the left side of the center axis AX of the mounting area 7 and the lines L1'-L3' are disposed at the right side of the center axis AX.

At the right side of the center axis AX, the central line L1' includes five light-emitting elements 1, and the line of periphery L3' includes two light-emitting elements 1. The light-emitting elements 1 arranged in the central line L1' outnumbers the light-emitting elements 1 arranged in the line of periphery L3'. Just symmetrical with the left side of the center axis AX, there is one intermediate line L2' between the central line L1' and the line of periphery L3', and the intermediate line L2' includes five light-emitting elements 1 that is the same number of light-emitting elements 1 included in the central line L1'. Just symmetrical with the left side of the center axis AX, the light-emitting elements 1 arranged in the intermediate line L2' are shifted with respect to the light-emitting elements 1 arranged in the central line L1'. The lighting elements 1 disposed in the lines L1-L3 and L1'-L3' are divided in two groups G1 and G2 each including the same number of light-emitting elements. In this embodiment, the group G1 and the group G2 is just divided at the center axis AX of the mounting area 7. Each group includes the same number of light-emitting elements 1, and here the group G1 includes 12 light-emitting elements 1, and the group G2 includes 12 light-emitting elements 1.

Compared to the lighting device 10 as shown in FIG. 2, the lighting device 30 may be a lighting device with lower intensity of light, but the lighting device 30 can be driven by lower power.

(Fourth Embodiment)

Figure 7:
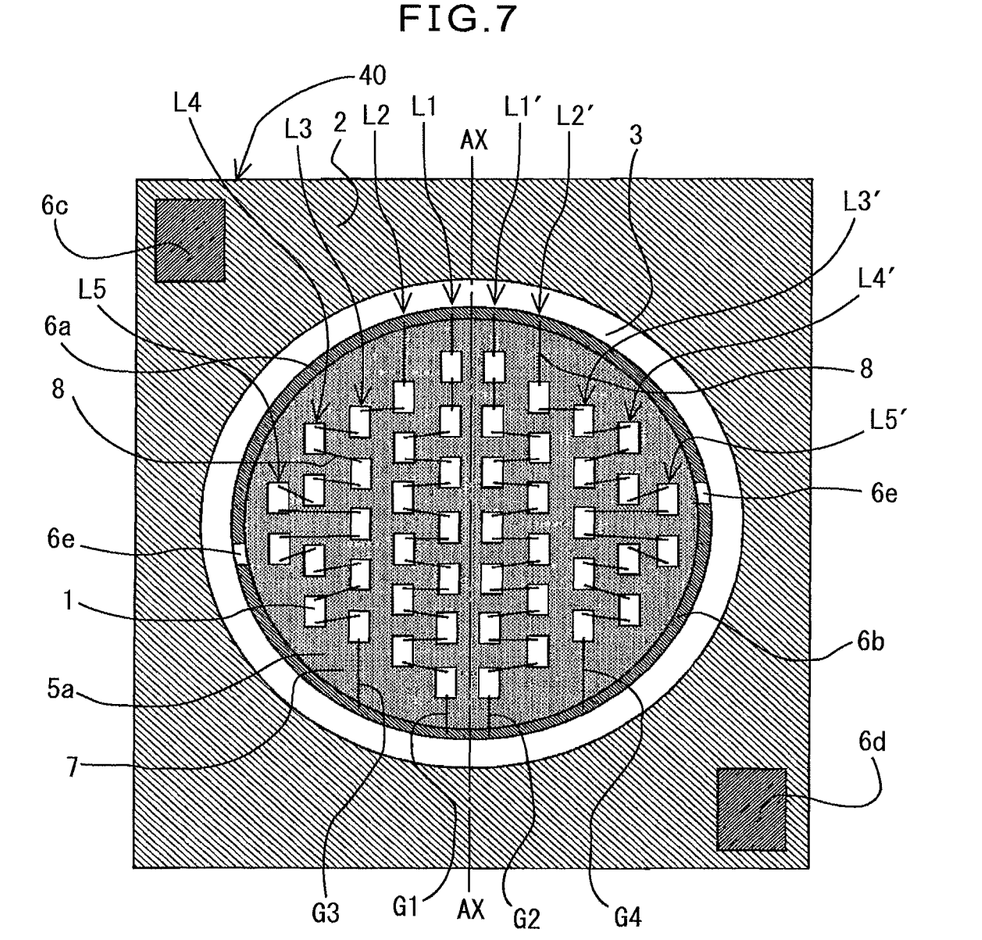
FIG. 7 is a plan view of a lighting device according to a fourth embodiment of the present invention.

Next, FIG. 7 is a plan view of a lighting device 40 according to a fourth embodiment of the present invention A basic configuration of the lighting device 40 in the fourth embodiment is similar to the basic configuration of the lighting device 10 shown in FIG. 2 and FIG. 3, and a same reference number is attached to a same and/or similar element, portion, line, and/or group, and repeated explanation is omitted. The cross-sectional view can be similar to the cross-sectional view of the lighting device 10 shown in FIG. 3, and therefore, omitted.

The lighting device 40 differs from the lighting device 10 in the number of the light-emitting elements 1 disposed at the mounting area 7 and an electrically connecting configuration by the wire 8. For more details, in the lighting device 10, the number of light-emitting elements 1 disposed at the mounting area 7 is 36, and the 36 light-emitting elements 1 disposed in ten lines L1-L5 and L1'-L5' at the mounting area 7 are divided into three groups G1, G2, and G3, as shown in FIG. 2. Each group of three groups G1, G2, and G3 include 12 light-emitting elements 1. On the other hand, in the lighting device 40, the number of light-emitting elements 1 disposed in ten lines L1-L5 and L1'-L5' at the mounting area 7 is 48, and the 48 light-emitting elements 1 are divided into four groups G1, G2, G3, and G4. Each group of the four groups G1, G2, G3, and G4 include 12 light-emitting elements 1. The light-emitting elements 1 are arranged in lines L1-L5 and L1'-L5' that are extended parallel with one another at the circular mounting area 7 of the substrate 2 between the first connecting electrode 6a ant the second connecting electrode 6b. As shown in this embodiment, the lighting device 40 can include a group that includes some of the light-emitting elements arranged in two or more lines. For more details, the first group G1 includes seven light-emitting elements 1 arranged in the first line L1 and five light-emitting elements 1 arranged in the second line L2, however the third group G3 includes one light-emitting element 1 arranged in a first intermediate line L2 and five light-emitting elements 1 arranged in a second intermediate line L3 and four light-emitting elements 1 arranged in a third intermediate line L4 and two light-emitting elements 1 in the line of periphery L5. The second group G2 and the fourth group G4 are arranged symmetrically with the first group G1 and the third group G3. Compared to the lighting device 10 shown in FIG. 2 under a common drive condition, the lighting device 40 can be a lighting device with higher intensity of light, and requires higher power.

(Fifth Embodiment)

Figure 8:
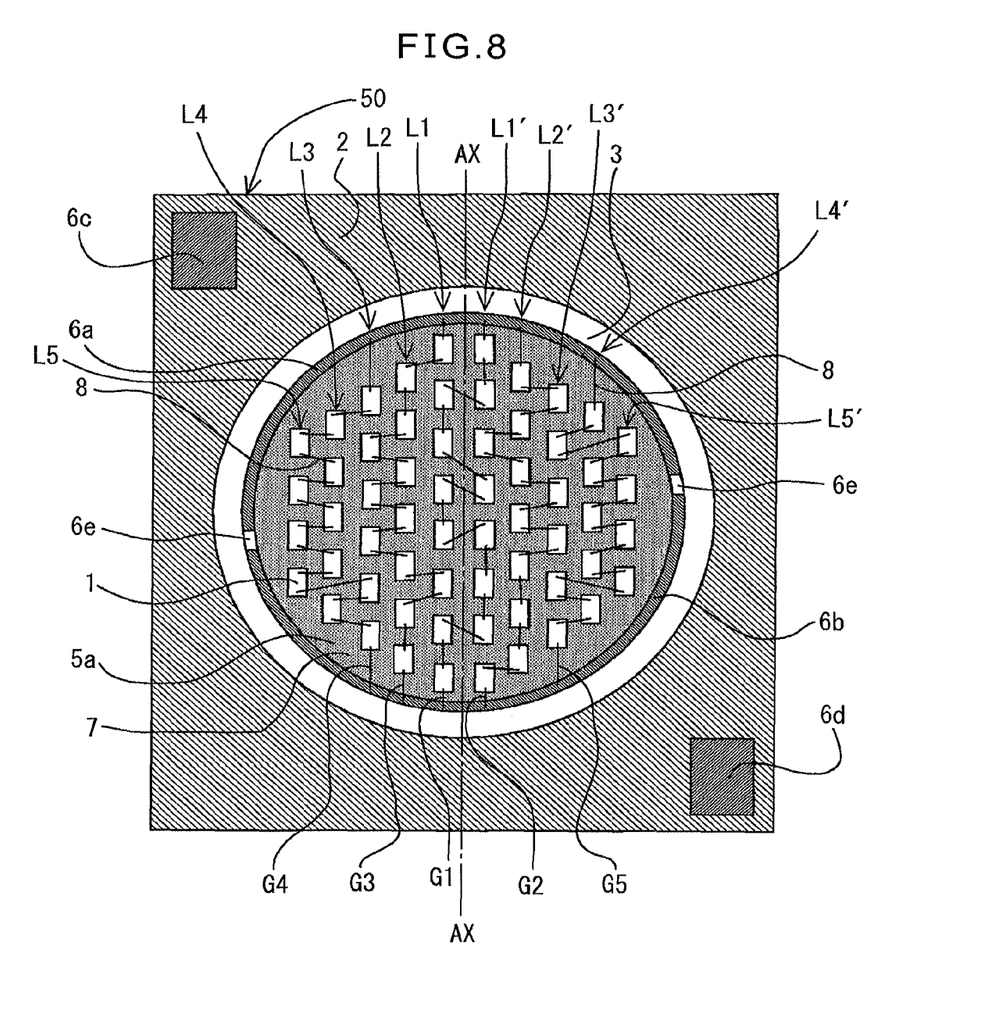
FIG. 8 is a plan view of a lighting device according to a fifth embodiment of the present invention.

Next, FIG. 8 is a plan view of a lighting device 50 according to a fifth embodiment of the present invention. A basic configuration of the lighting device 50 in the fifth embodiment is similar to the basic configuration of the lighting device 10 of the first embodiment as shown in FIG. 2 and FIG. 3 and to the basic configuration of the lighting device 40 of the fourth embodiment as shown in FIG. 7, and a same reference number is attached to a same and/or similar element, portion, line and/or group, and repeated explanation is omitted. The cross-section sectional view can be similar to the cross-sectional view of the light-emitting device 10 shown in FIG. 3, and therefore, omitted.

The lighting device 50 differs from the lighting device 40 shown in FIG. 4 in the number of the light-emitting elements 1 disposed at the mounting area 7 and an electrically connecting configuration by the wire 8. For more details, in the lighting device 40, the number of the light-emitting elements 1 arranged in the circular mounting area 7 is 48 and the 48 light-emitting elements 1 disposed in ten lines L1-L5 and L1'-L5' at the mounting area 7 are divided into four groups G1, G2, G3, and G4. Each group of the four groups G1, G2, G3, and G4 include 12 light-emitting elements 1. On the other hand, in the lighting device 50, the number of light-emitting elements 1 arranged in the mounting area 7 is 60, and the 60 light-emitting elements are divided into five groups G1, G2, G3, G4, and G5. Each group of the five groups G1, G2, G3, G4, and G5 include 12 light-emitting elements. The number of the light-emitting elements 1 disposed in the circular mounting area 7 of the lighting device 50 is larger than the number of the lighting device 40. Also, the number of groups each including the same number of light-emitting elements 1 is larger than the number of groups of the lighting device 40. Compared to the lighting device 40 shown in FIG. 7 under a common drive condition, the lighting device 40 can be a lighting device with higher intensity of light and, requires higher power.

As described above, it is possible to combine a serial connection and a parallel connection of light-emitting elements 1, in accordance with a required light of intensity and/or power consumption for a lighting device. Also, it is disclosed that the light-emitting elements at a circular mounting area 7 can be disposed as evenly as possible, according to embodiments of the present invention.

Furthermore, while certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

What is claimed is:

1. A lighting device comprising:
a substrate including a circular mounting area, a first connecting electrode disposed on the substrate, and a second connecting electrode oppositely disposed on the substrate to the first connecting electrode across the circular mounting area; and
light-emitting elements mounted in the circular mounting area and arranged in lines that are extended along a center axis of the circular mounting area, wherein
the light-emitting elements are divided into groups each including the same number of light-emitting elements,
the light-emitting elements within each group are electrically connected in series with one another by metallic wires and electrically connected in series to the first connecting electrode and to the second connecting electrode of the substrate, and
the groups each including the same number of light-emitting elements are electrically connected in parallel between the first connecting electrode and the second connecting electrode,
the lines include two central lines that are extended along the center axis of the circular mounting area, and
all of the light-emitting elements in the two central lines are electrically connected in series to constitute one group of the groups each including the same number of light-emitting elements.

2. The lighting device according to claim 1,
wherein the groups further include a group in which the same number of light-emitting elements are selected among three or more lines and are electrically connected in series with one another by metallic wires.

3. The lighting device according to claim 1,
wherein the light-emitting elements arranged in the lines are positioned symmetrically with respect to the center axis of the circular mounting area.

4. A lighting device comprising:
a substrate including a circular mounting area, a first connecting electrode disposed on the substrate, and a second connecting electrode oppositely disposed on the substrate to the first connecting electrode across the circular mounting area; and
light-emitting elements mounted in the circular mounting area and arranged in lines that are extended along a center axis of the circular mounting area, wherein
the light-emitting elements are divided into groups each including the same number of light-emitting elements,
the light-emitting elements within each group are electrically connected in series with one another by metallic wires and electrically connected in series to the first connecting electrode and to the second connecting electrode of the substrate,
the groups each including the same number of light-emitting elements are electrically connected in parallel between the first connecting electrode and the second connecting electrode,
the lines include a central line extended in a central portion of the circular mounting area, a line of periphery positioned away from the central line, and one or more intermediate lines extended between the first connecting electrode and the second connecting electrode and positioned between the central line and the line of periphery, and
the number of light-emitting elements arranged in each line decreases from the central line through the intermediate line to the line of periphery.

5. The lighting device according to claim 1,
wherein the lines include the two central lines and two lines of periphery respectively positioned away from the central lines, and one or more intermediate lines extended between the first connecting electrode and the second connecting electrode and positioned between a central line and a line of periphery,
wherein the number of light-emitting elements disposed in each line decreases one line by one line from the central line through the one or more intermediate lines to the line of periphery.

6. The lighting device according to claim 1,
wherein the substrate comprises a ceramic.

7. The lighting device according to claim 1,
wherein the substrate comprises an electrically-insulating material and a metal base disposed in contact with the electrically-insulating material.

8. The lighting device according to claim 1,
wherein the substrate further includes an opening that passes through the substrate from an upper surface to a lower surface of the substrate, and a metal base disposed in contact with the lower surface of the substrate, the opening of the substrate demarcates the circular mounting area in that an upper surface of the metal base appears, and the light-emitting elements are thermally connected to the upper surface of the metal base.

9. The lighting device according to claim 1,
wherein the substrate further includes a circular light-reflecting layer that demarcates the circular mounting area.

10. The lighting device according to claim 4,
wherein the first connecting electrode is disposed along an outline of the circular mounting area and the second connecting electrode is disposed along the outline of the circular mounting area with an electrically insulating portion between the first connecting electrode and the second connecting electrode.

11. The lighting device according to claim 5,
wherein the first connecting electrode includes an arc shape along an outline of the circular mounting area and the second connecting electrode includes an arc shape along the outline of the circular mounting area.

12. The lighting device according to claim 1,
wherein the light-emitting elements in the intermediate line extended between the first connecting electrode and the second connecting electrode are shifted with respect to the light-emitting elements in a neighboring line.

13. The lighting device according to claim 4,
wherein the light-emitting elements in the intermediate line extended between the first connecting electrode and the second connecting electrode are shifted with respect to the light-emitting elements in a neighboring line.

14. A lighting device comprising:
a substrate including a circular mounting area, a first connecting electrode disposed on the substrate, and a second connecting electrode oppositely disposed on the substrate to the first connecting electrode across the circular mounting area; and light-emitting elements mounted in the circular mounting area and arranged in lines that are extended along a center axis of the circular mounting area, wherein the light-emitting elements are divided into groups each including the same number of light-emitting elements, the light-emitting elements within each group are electrically connected in series with one another by metallic wires and electrically connected in series to the first connecting electrode and to the second connecting electrode of the substrate, the groups each including the same number of light-emitting elements are electrically connected in parallel between the first connecting electrode and the second connecting electrode, the lines include two central lines that are extended along the center axis of the circular mounting area, two lines of periphery respectively positioned away from the central lines, and one or more intermediate lines extended between the first connecting electrode and the second connecting electrode and positioned between the central line and the line of periphery, and the light-emitting elements in the intermediate line extended between the first connecting electrode and the second connecting electrode are shifted with respect to the light-emitting elements in a neighboring line.

15. The lighting device according to claim 14, wherein all of the light-emitting elements in the two central lines are electrically connected in series to constitute one group of the groups each including the same number of light-emitting elements.

* * * * *